United States Patent [19]

Huijsing et al.

[11] Patent Number: 5,155,447
[45] Date of Patent: Oct. 13, 1992

[54] MULTI-STAGE AMPLIFIER WITH CAPACITIVE NESTING AND MULTI-PATH FORWARD FEEDING FOR FREQUENCY COMPENSATION

[75] Inventors: Johan H. Huijsing, Schipluiden; Maarten J. Fonderie, Delft, both of Netherlands

[73] Assignee: Signetics Company, Sunnyvale, Calif.

[21] Appl. No.: 654,855

[22] Filed: Feb. 11, 1991

[51] Int. Cl.⁵ ............................................. H03F 1/34
[52] U.S. Cl. .................................... 330/107; 330/151; 330/260; 330/294
[58] Field of Search ................. 330/151, 107, 260, 294

[56] References Cited

U.S. PATENT DOCUMENTS 4,502,017 2/1985 Van De Plassche et al. ....... 330/151
4,559,502 12/1985 Huijsing .............................. 330/294

FOREIGN PATENT DOCUMENTS 3829135 3/1990 Fed. Rep. of Germany.

OTHER PUBLICATIONS

"NE5533/5533A, NE/SA/SE5534/5534A Dual and Single Low Noise Op Amp", *Signetics Linear Data Manual, Industrial*, vol. 2, Signetics Co., 1989, pp. 4–106 to 4–111.

*Primary Examiner*—James B. Mullins

[57] ABSTRACT

A multi-stage amplifier utilizes capacitive nesting of three or more amplifier stages in combination with multiple feed-forward paths to achieve frequency compensation. Two stages ($A_M$ and $A_O$) in cascade are first nested with a pole-splitting capacitor (C1) to form a stable device. A stable three-stage amplifier is then created by nesting the two-stage device and a further stage ($A_I$) with another pole-splitting capacitor (C2) where feed-forward paths are provided from the further stage to both of the other stages.

20 Claims, 7 Drawing Sheets

EITHER $V_{O+}$ OR $V_{O-}$ MAY BE SUBSTANTIALLY FIXED

MULTI-STAGE AMPLIFIER WITH CAPACITIVE NESTING AND MULTI-PATH FORWARD FEEDING FOR FREQUENCY COMPENSATION

FIELD OF USE

This invention relates to multi-stage amplifiers having frequency compensation, and, more particularly, to multi-stage amplifiers that are suitable for operational amplifiers made in semiconductor integrated circuit form.

BACKGROUND ART

An operational amplifier ("op amp") is an electronic circuit that amplifies an input signal differentially supplied between a noninverting input terminal and an inverting input terminal to produce an amplified output signal at an output terminal. An op amp is typically employed in an amplifier system having a feedback network connected between the output terminal (or simply "output") and one or both of the input terminals (or simply "inputs"). The gain in the negative feedback loop is $-\mu\beta$, where $\mu$ is the forward gain of the op amp, and $\beta$ is the gain of the feedback network.

When the input signal varies at some frequency, the output signal varies similarly. At low frequency, the two signals are substantially in phase. As frequency increases, the phase of the output signal falls progressively behind that of the input signal. The magnitude of the loop gain decreases. If the phase difference between the signals reaches 180° while $|\mu\beta|$ is greater than 1, the feedback becomes positive. The system oscillates and is thus unstable.

The minimum acceptable stability margin is considered to occur when the loop phase difference equals 135° at the point where $|\mu\beta|$ is 1. Because the feedback network for a system utilizing an op amp is generally provided after op amp design is completed, the design is typically based on the "worst-case" assumption that $\beta$ is 1. This leads to the stability criterion that forward gain $\mu$ not roll off more than 9 dB/octave out to the unity-gain frequency.

An easy way to meet the preceding stability rule is with a single transconductance amplifier stage. Turning to the drawings, FIG. 1 illustrates a conventional bipolar differential stage A of this type. Input voltages $V_{I+}$ and $V_{I-}$, whose difference is amplifier input signal $V_I$, are respectively supplied to the noninverting and inverting inputs of stage A. Its noninverting output provides amplifier output voltage $V_O$.

The frequency response of stage A is largely determined by a single dominant pole dependent on the parasitic capacitance CP at the output. FIG. 2 shows asymptotes for how $\mu$ varies with frequency f for stage A. The gain drops 6 dB/oct. as the frequency $f_o$ of the dominant pole is passed and then 6 dB/oct. more as the higher pole frequency $f_L$ that limits the bandwidth is passed. Bandwidth-limiting frequency $f_L$, which is a characteristic of the overall amplifier system and cannot readily be altered, occurs beyond unity-gain frequency $f_U$. Stage A thereby automatically satisfies the stability criterion. Unfortunately, the maximum gain is typically on the order of 40 dB. This is much too low for many applications.

The gain can be increased by cascading two amplifier stages $A_I$ and $A_O$ as shown in FIG. 3. Output stage $A_O$ functions as an inverter. A capacitor C connected across stage $A_O$ provides frequency compensation for the amplifier.

FIG. 4 shows a typical asymptotic frequency response for the two-stage amplifier in FIG. 3. Two dominant poles, represented by pole frequencies $f_O$ and $f_I$ which respectively depend on the parasitic capacitances at the $A_O$ and $A_I$ outputs, largely determine the frequency characteristics. The gain roll-off increases 6 dB/oct. in passing each of frequencies $f_O$, $f_I$, and $f_L$. The upper curve in FIG. 4 shows how the asymptotic frequency response would appear if capacitor C were absent. The lower curve shows the actual compensated asymptotic response.

In the absence of capacitor C, the combination $A_I$ and $A_O$ would not meet the stability rule because $\mu$ drops 12 dB/oct. between $f_I$ and the unity-gain frequency. Capacitor C splits the dominant poles further, causing $f_I$ to move beyond the unity-gain point. The gain asymptotically rolls off at a straight 6 dB/oct. between $f_O$ and $f_U$ so that the amplifier meets the stability criterion. The maximum gain of approximately 80 dB is an improvement. However, $\mu$ is still too low for many applications.

Three or more amplifier stages can be placed in cascade to increase the gain further. While providing frequency compensation for such a device has generally been a complex process, U.S. Pat. No. 4,559,502 ("US 502") describes an elegant capacitive-nesting solution to the problem. FIG. 5 illustrates a three-stage amplifier disclosed in US 502.

The prior art amplifier in FIG. 5 is formed with input, intermediate, and output transconductance stages $A_I$, $A_M$, and $A_O$. Stages $A_I$ and $A_M$ function as noninverters. Stage $A_O$ again functions as an inverter. The $A_I$ noninverting output is connected to the noninverting input of stage $A_M$ whose noninverting output is connected to the noninverting input of stage $A_O$. Its output is an inverting output.

For convenience in later making a comparison to the present invention, the "noninverting" and "inverting" labels used here for the $A_O$ inputs and output in FIG. 5 are actually opposite to those employed in US 502. However, this does not affect the function of stage $A_O$ whose output voltage $V_O$ is still inverted relative to the $A_O$ input signal difference.

The capacitive nesting in FIG. 5 begins with the amplifier portion consisting of stages $A_M$ and $A_O$. A capacitor C1 is connected between the noninverting input of stage $A_O$ and its inverting output. The value of capacitor C1 is selected to make the portion $A_M$ and $A_O$ satisfy the stability rule. The frequency compensation is completed by connecting a capacitor C2 between the $A_M$ noninverting input and the $A_O$ inverting output. Capacitor C2 is chosen to have such a value that the combination of stage $A_I$ with portion $A_M$ and $A_O$ likewise satisfies the stability criterion.

Turning to FIG. 6 it depicts a typical version of the asymptotic frequency response for the amplifier of FIG. 5. The frequency characteristics are controlled by the two dominant poles represented by pole frequencies $f_O$ and $f_I$ (as described above) plus a third dominant pole represented by pole frequency $f_M$ dependent on the parasitic capacitance at the $A_M$ output. In the absence of capacitors C1 and C2, the gain roll-off at the unity-gain point would be far too much to satisfy the stability rule. See the upper curve in FIG. 6.

Insertion of capacitor C1 causes poles $f_O$ and $f_M$ to be split further apart. See the intermediate curve in FIG. 6. Insertion of capacitor C2 then splits poles $f_O$ and $f_I$. The lower curve in FIG. 6 shows the final compensated response. Lower pole $f_O$ has moved from starting point $f_{OS}$ to lower final point $f_{OF}$. Higher poles $f_I$ and $f_M$ have moved from starting points $f_{IS}$ and $f_{MS}$ to higher final points $f_{IF}$ and $f_{MF}$ beyond $f_U$. The asymptotic gain roll-off is an acceptable straight 6 dB/oct. all the way out to $f_U$.

FIG. 6 illustrates typical values that $f_I$, $f_M$, $f_O$, $f_U$, and $f_L$ might have in the amplifier of FIG. 5. These numerical values are not disclosed in US 502 but are presented solely for later comparison with the present invention.

Note that poles $f_I$ and $f_M$ are separated from each other by approximately a factor of two in the final compensated amplifier. In particular, $f_{IF}$ is one half of $f_{MF}$ in FIG. 6. This separation results from usage of capacitor C2 and is needed to prevent the amplifier from going into resonance. Unfortunately, the separation leads to a factor-of-two reduction in frequency bandwidth. Providing the amplifier with additional nests to increase the gain further likewise reduces the bandwidth by an additional factor of two for each additional nest. A frequency-compensation technique that employs the basic capacitive-nesting principle of US 502, but overcomes the bandwidth loss that occurs because of capacitor C2, would be quite advantageous.

German Patent Publication 3829135 A1 ("German 135") describes a noteworthy approach to the matter of achieving high gain without significantly losing bandwidth. In German 135, the amplifier input signal is provided to two or more differential input stages connected in parallel. One of the input stages has a low gain and high bandwidth, while another has a high gain and a low bandwidth. Each remaining input stage (if any) has an intermediate gain and an intermediate bandwidth. The amplified output signals of the input stages are combined and supplied to a current-amplifying output stage that provides the amplifier output signal.

German 135 states that frequency compensation need only be supplied for the input stage having the high bandwidth and low gain. While this may be true, German 135 seems to lack the advantageous straight 6 dB/oct. asymptotic gain roll-off between the lowest dominant pole frequency and the unity-gain point. In the preferred example, the frequency compensation for part of the frequency range is apparently achieved with a single capacitor connected across the input stages. German 135 does not use anything like capacitive nesting.

GENERAL DISCLOSURE OF THE INVENTION

The present invention employs a multi-path feed-forward technique in combination with capacitive nesting to provide frequency compensation in a multi-stage amplifier suitable for use in op amps. The basic principle of the invention entails first creating a stable two-stage amplifier by capacitively nesting a pair of amplifier stages in cascade. A stable three-stage amplifier is then created by capacitively nesting the two-stage device and a further amplifier stage with feed-forward paths being provided from the further stage to both of the other stages.

The parameters of the present three-stage amplifier can be chosen at such values that the low-frequency gain is slightly greater than that achievable in US 502. Importantly, the three-stage amplifier of the invention avoids the approximate factor-of-two loss in bandwidth that occurs in US 502. The multi-path forward feeding is responsible for these two advantages.

The gain typically rolls off at a straight asymptotic 6dB/octave out to the unity-gain frequency. This is highly desirable. In short, the three-stage amplifier acts like an amplifier having the high-frequency response of a two-stage device and the low-frequency gain of a three-stage device. Furthermore, no bandwidth loss occurs if the further stage in the nested structure contains two or more capacitively nested substages provided with multiple feed-forward paths according to the invention.

Before going more specifically into the structure of the invention, the following items should be noted. As used here to describe the relationship between an output signal produced by a device, such as an amplifying stage, in response to an input signal supplied to the device, the term "inverted" means that the output signal is substantially inverse—i.e., reversed in polarity ignoring propagation delay—to the input signal when the device is in its open-loop condition. Similarly, the term "noninverted" means that the output signal is substantially in phase—i.e., of the same polarity ignoring propagation delay—with the input signal when the device is in its open-loop condition.

Turning now to the basic structure of the invention, the present amplifier contains an input stage, an intermediate stage, and an output stage. The input stage amplifies an input signal received at least partly at an input to produce a pair of like-polarity output signals at a pair of corresponding outputs that preferably are electronically decoupled from each other. The two output signals from the input stage typically are noninverted but may be inverted. The intermediate stage amplifies an input signal received at least partly at an input coupled to one of the outputs of the input stage to produce a noninverted output signal at an output. The output stage amplifies an input signal received at least partly at an input coupled to the output of the intermediate stage and also coupled to the other output of the input stage to produce an output signal at an output. The coupling of the input stage to the output stage sets up a separate feed-forward path through the amplifier.

A first capacitor is coupled between the input of the output stage and a node coupled to (a) the output of the output stage if its output signal is inverted or (b) a source of a reference voltage if the output of the output stage is noninverted. The first capacitor provides frequency compensation for the intermediate and output stages. A second capacitor is coupled between the input of the intermediate stage and the node to provide frequency compensation for the entire amplifier. The values of the capacitors are selected to make the forward gain of the amplifier roll off no more than 9 dB/octave out to its unity-gain frequency. The amplifier thus satisfies the preceding gain roll-off stability rule.

The combination of the capacitive nesting and the additional feed-forward path from the input stage to the output stage enables the invention to achieve the highly advantageous gain and frequency characteristics described above. The invention is relatively simple and can be implemented with conventional semiconductor elements. Consequently, the present amplifier provides a material advance over the prior art.

BRIEF DESCRIPTION OF THE DRAWINGS

Like reference symbols are employed in the drawings and in the description of the preferred embodiments to represent the same or very similar item or items.

Figure 1:
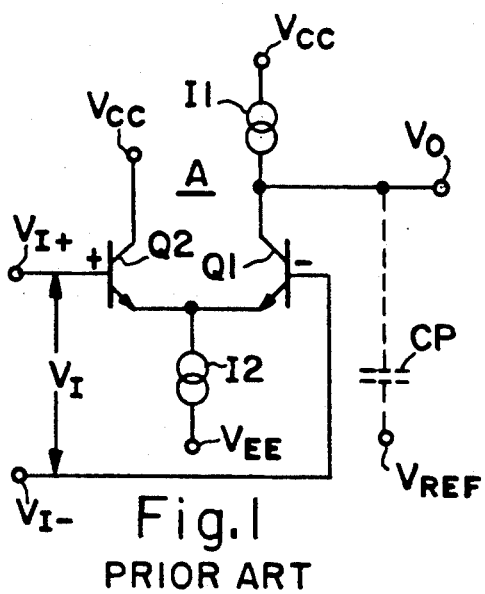
FIGS. 1, 3, and 5 are diagrams of prior art amplifiers.
Figure 2:
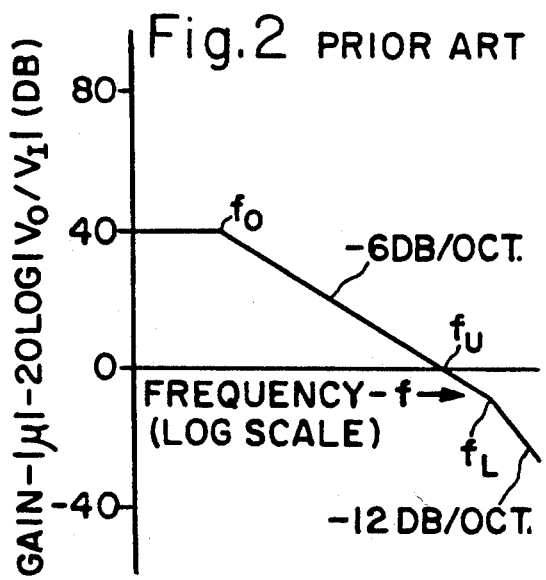
FIGS. 2, 4, and 6 are logarithmic graphs of asymptotic frequency response for the respective amplifiers of FIGS. 1, 3, and 5.
Figure 3:
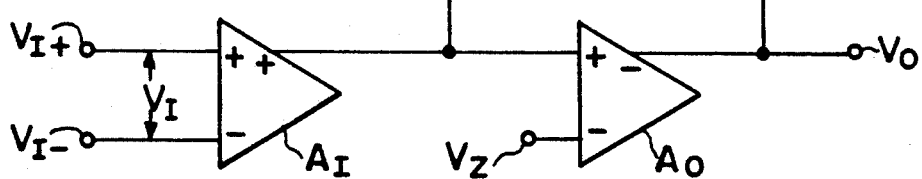
Figure 4:
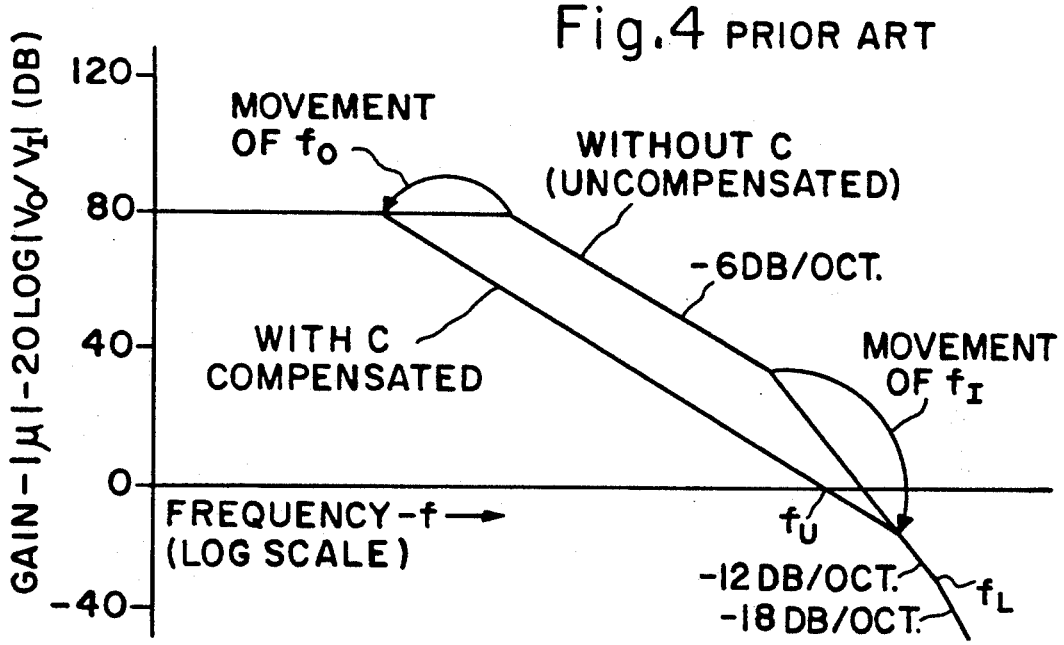

Noninverting inputs and outputs are indicated with "+" signs in the drawings, whereas inverting inputs and outputs are noted with "−" signs. Due to spacing constraints, multiple outputs that provide like-polarity signals from an amplifier stage shown in symbolic (triangular) form are denoted with only a single "+" or "−" sign. The additional feed-forward paths of the invention are indicated in heavy lines in the drawings.

DESCRIPTION OF PREFERRED EMBODIMENTS

Figure 7:
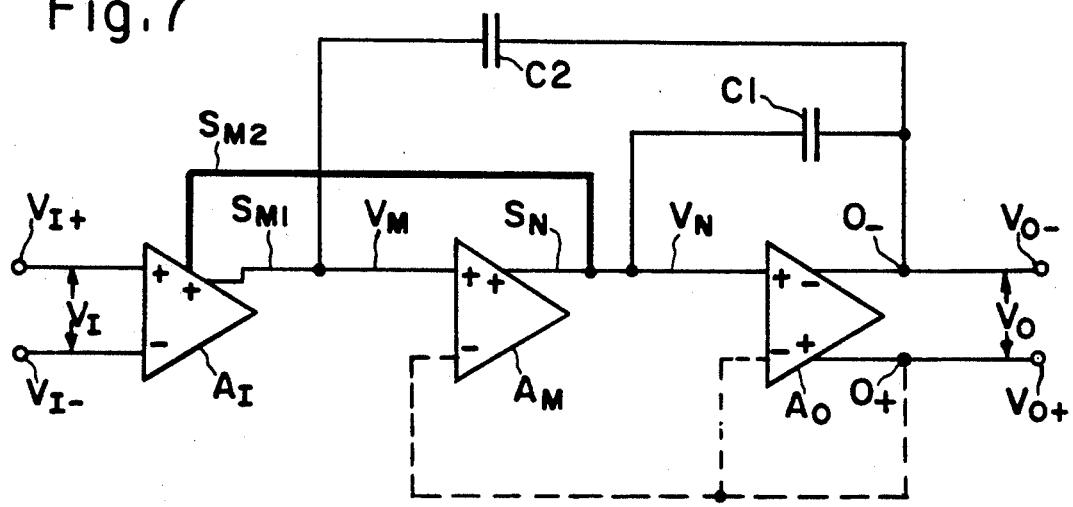
FIG. 7 is a block diagram of a generalized three-stage amplifier in accordance with the invention.

Referring to FIG. 7, it illustrates a general version of a three-stage amplifier that is frequency compensated in accordance with the invention. This amplifier contains input stage $A_I$, intermediate stage $A_M$, and output stage $A_O$ arranged in cascade. Each of stages $A_I$, $A_M$, and $A_O$ is a transconductance amplifier.

In the frequency-compensation technique of the invention, capacitor C1 is first nested with stages $A_O$ and $A_M$ to form a two-stage device whose gain falls well within the 9 dB/oct. roll-off stability rule. Capacitor C2 is then nested with this two-stage device and stage $A_I$ from which feed-forward paths are provided to both of stages $A_M$ and $A_O$. The resulting three-stage amplifier meets the stability criterion separately for each feed-forward path and, consequently, for the entire amplifier.

In more detail, each stage $A_I$, $A_M$, or $A_O$ has either a single input or a noninverting input and an inverting input. In the single-input case, the input is inverting for both stages $A_M$ and $A_O$ but may be either noninverting or inverting for stage $A_I$. In the two-input case, each stage $A_I$, $A_M$, or $A_O$ may function as a "differential" amplifying device having little input offset voltage. Alternatively, each stage $A_I$, $A_M$, or $A_O$ may function as a "nondifferential" amplifying device for which a selected nonnegligible offset voltage exists between the device inputs.

With the foregoing in mind, input stage $A_I$ preferably has noninverting and inverting inputs for respectively receiving input voltages $V_{I+}$ and $V_{I-}$, either of which may be substantially fixed. The difference $V_I$ between voltages $V_{I+}$ and $V_{I-}$ is then the amplifier input signal. Alternatively, if stage $A_I$ has only one input, the amplifier input signal is voltage $V_{I+}$ or voltage $V_{I-}$ depending on which input is present.

Stage $A_I$ amplifies the amplifier input signal ($V_I$, $V_{I+}$, or $V_{I-}$) to produce a main output signal $S_{M1}$ at a main noninverting output. Stage $A_I$ also amplifies the amplifier input signal to produce a further output signal $S_{M2}$ at a further noninverting output. Signals $S_{M1}$ and $S_{M2}$ are of the same polarity. Both are noninverted relative to the amplifier input signal if it consists of voltage $V_I$ or voltage $V_{I+}$. Signals $S_{M1}$ and $S_{M2}$ are inverted if the amplifier input signal is voltage $V_{I-}$.

The two $A_I$ noninverting outputs are substantially (electronically) decoupled from each other. As a result, undesired feedback into one of the $A_I$ outputs does not significantly affect the signal characteristics at the other $A_I$ output.

The main ($S_{M1}$) noninverting output of stage $A_I$ is connected to the noninverting input of intermediate stage $A_M$. Signal $S_{M1}$ and signal $V_M$, which is provided to the $A_M$ noninverting input, are the same voltage but differ in current level. Stage $A_M$ amplifies signal $V_M$ to produce a noninverted output signal $S_N$ at a noninverting output. If stage $A_M$ has an inverting input, signal $S_N$ is produced by amplifying signal $V_M$ relative to the signal at the $A_M$ inverting input.

The noninverting output of stage $A_M$ is connected to the noninverting input of output stage $A_O$. The further ($S_{M2}$) noninverting output of stage $A_I$ is also connected to the $A_O$ noninverting input to set up a separate feed-forward path through the amplifier. Signals $S_{M2}$ and $S_N$ and signal $V_N$, which is provided to the $A_O$ noninverting input, are the same voltage but differ in current level. Stage $A_O$ amplifies voltage $V_N$ to produce a single amplifier output signal or a pair of opposite-polarity amplifier output signals. If stage $A_O$ has an inverting input, the amplification is done relative to the signal at the $A_O$ inverting input.

FIG. 7 indicates that voltages $V_{O-}$ and $V_{O+}$ are present at nodes O− and O+ respectively connected to inverting and noninverting outputs of stage $A_O$. FIG. 7 also indicates that either voltage $V_{O+}$ or voltage $V_{O-}$ may be substantially fixed. Consequently, there are three basic versions of the present amplifier:

(1) Stage $A_O$ provides voltage $V_{O-}$ as an inverted amplifier output signal, node O+ being connected to a source of a substantially constant reference voltage;

(2) Stage $A_O$ provides voltage $V_{O+}$ as a noninverted amplifier output signal, node O− being connected to a source of a substantially constant reference voltage; and (3) Stage $A_O$ provides voltages $V_{O+}$ and $V_{O-}$ respectively as noninverted and inverted amplifier outputs signals, their difference being output voltage $V_O$ which is inverted relative to signal $V_N$.

The $A_O$ inverting input, if present, is typically connected to node O+. The $A_M$ inverting input, if present, is likewise typically connected to node O+. The $A_M$ and $A_O$ inverting inputs thereby either receive the noninverted amplifier output signal ($V_{O+}$), when it is provided, or a reference voltage.

Capacitor C1 is connected between the $A_O$ noninverting input and node O−. By suitably choosing the value of capacitor C1, it enables the gain of amplifier portion $A_M$ and $A_O$ to roll off much less than 9 dB/oct. out to its unity-gain frequency. Capacitor C2 is connected between the $A_M$ noninverting input and node O−. The values of capacitors C1 and C2 are selected to make the gain of the full amplifier roll off no more than 9 dB/oct. out to its unity-gain frequency. In view of the three amplifier versions discussed above, the right-hand plates of capacitors C1 and C2 receive either the inverted amplifier output signal ($V_{O-}$), when it is provided, or a reference voltage.

Figure 5:
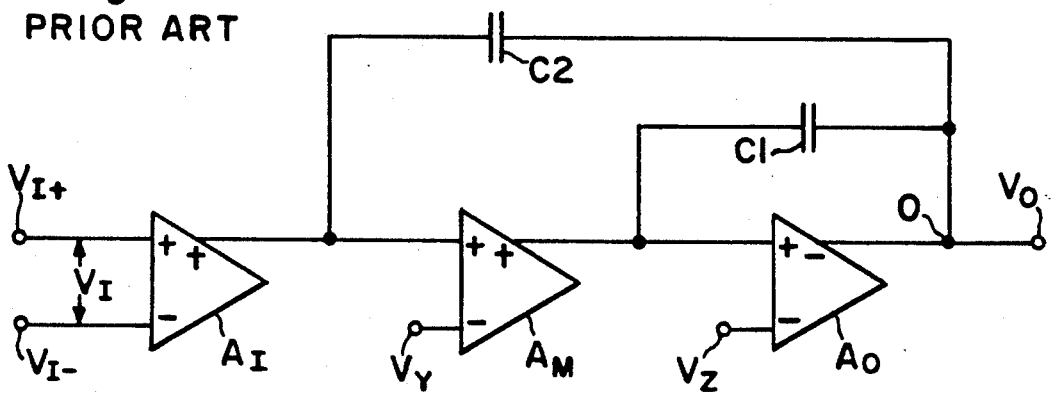
Figure 8:
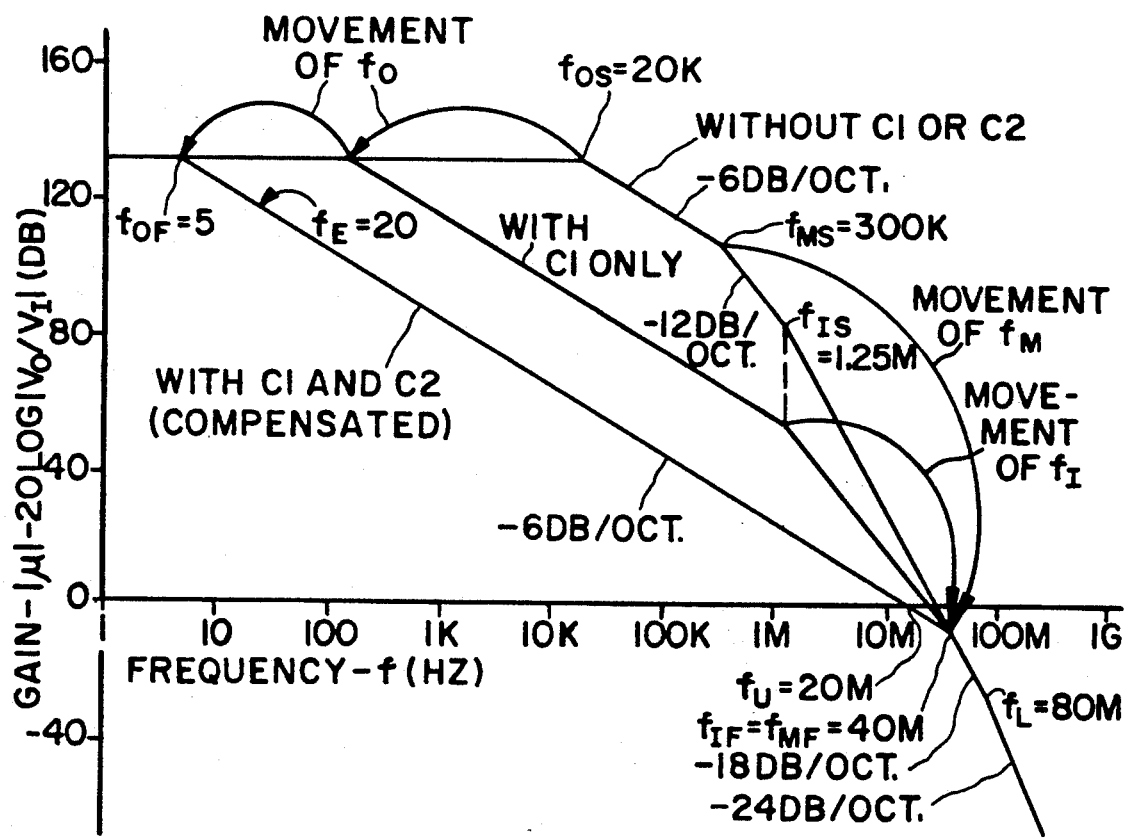
FIG. 8 is a logarithmic graph of asymptotic frequency response for the amplifier of FIG. 7.

FIG. 8 shows a typical asymptotic frequency response for the amplifier of FIG. 7. As with the prior art device in FIG. 5, the frequency characteristics are largely determined by the three dominant poles dependent on the parasitic capacitances at the outputs of stages $A_I$, $A_M$, and $A_O$. These poles are again respectively represented by pole frequencies $f_I$, $f_M$, and $f_O$. For convenience, the amplifier of FIG. 5 is referred to as the "prior art device" in the following discussion about FIGS. 8 and 6.

If capacitors C1 and C2 were absent, poles $f_I$, $f_M$, and $f_O$ would be at starting points $f_{IS}$, $f_{MS}$, and $f_{OS}$. To enable the performance of the present amplifier to be compared directly to that of the prior art device, the values for $f_{IS}$, $f_{MS}$, and $f_{OS}$ in FIG. 8 are respectively the same as in FIG. 6.

With capacitors C1 and C2 absent, the variation in frequency response for the present amplifier would be largely the same as that for the prior art device with capacitors C1 and C2 missing. Compare the upper curve in FIG. 8 to the upper curve in FIG. 6. The gain roll-off at the unity-gain point would be 18 dB/oct. Oscillations could occur at high frequency if the amplifier were used in a feedback arrangement.

Figure 6:
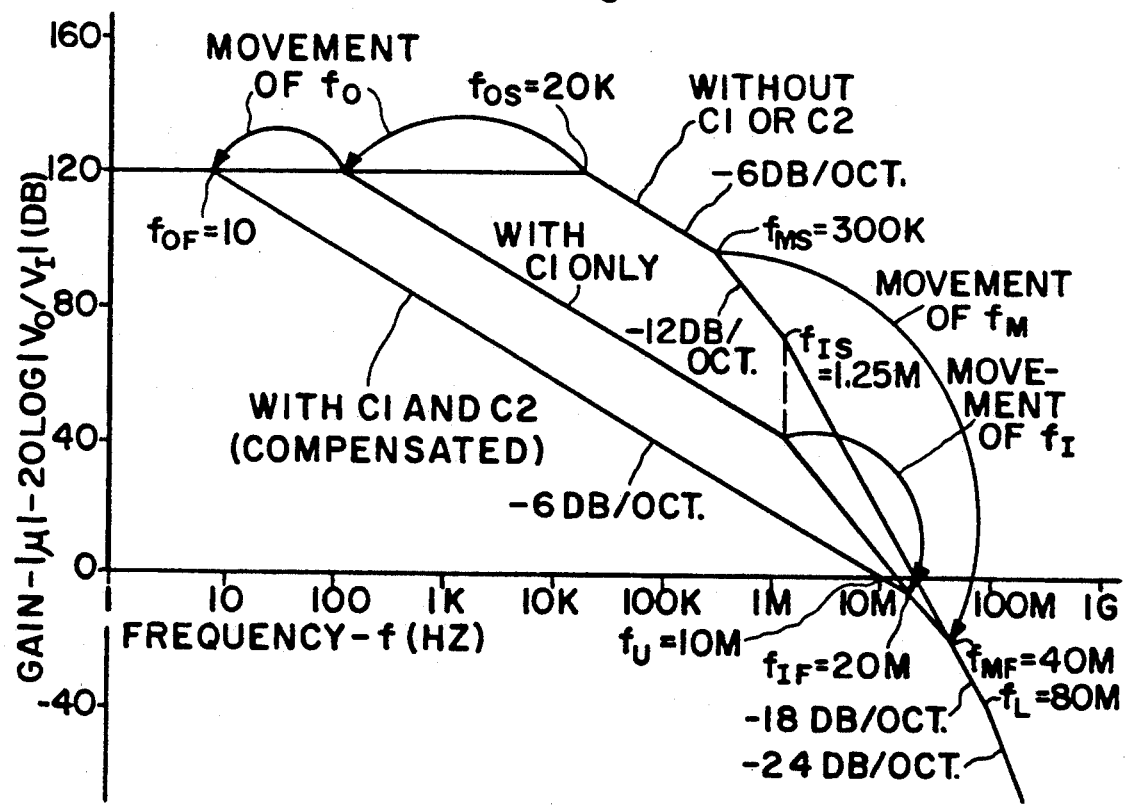

Inserting capacitor C1 into the present amplifier splits poles $f_M$ and $f_O$ in generally the same way as in the prior art device. Compare the intermediate curve in FIG. 8 to the intermediate curve in FIG. 6. Lower pole $f_O$ moves down to a lower value, while higher pole $f_M$ moves up to final position $f_{MF}$. As indicated in FIGS. 8 and 6, the value of $f_{MF}$ is the same for both amplifiers.

As with the prior art device, next inserting capacitor C2 into the present amplifier causes poles $f_O$ and $f_I$ to be split further apart. Compare the lower curve in FIG. 8 to the lower curve in FIG. 6. Lower pole $f_O$ moves further downward to final position $f_{OF}$, while higher pole $f_I$ moves upward to final position $f_{IF}$. The forward gain for the present amplifier asymptotically rolls off no more than a straight 6 534 dB/oct. out to unity-gain frequency $f_U$. The present amplifier thereby satisfies the gain roll-off stability rule.

Importantly, optimum choice for the capacitor values enables poles $f_O$ and $f_I$ to move further apart in the present amplifier than in the prior art device. More specifically, $f_I$ moves all the way up to $f_M$ in the present amplifier. That is, $f_{IF}$ equals $f_{MF}$ so as to create a double pole. In contrast, as mentioned above, $f_{IF}$ is approximately a factor-of-two less than $f_{MF}$ in the prior art device.

The extra feed-forward path from stage $A_I$ to stage $A_O$ is responsible for the capability to choose the capacitor values so as to obtain the additional movement of poles $f_I$ and $f_O$ in the present amplifier. In particular, the extra feed-forward path overcomes part of the phase lag through stage $A_M$. Insofar as frequency compensation is concerned, the amplifier of FIG. 7 acts much like a two-stage device rather than a three-stage amplifier.

Because the factor-of-two separation between $f_{IF}$ and $f_{MF}$ is eliminated in the present amplifier, its unity-gain frequency is twice that of the prior art device. For example, FIG. 8 indicates that $f_U$ is about 20 MHz in the specific example of the present amplifier. Conversely, FIG. 6 indicates that $f_U$ is only 10 MHz in the specific example of the prior art device. Accordingly, the frequency range of the present amplifier is approximately twice that of the closest prior art device.

The extra feed-forward path in the present amplifier results in approximately 12 dB of additional gain at low frequency—i.e., a factor of four increase. For example, the maximum low-frequency gain is about 132 dB in the specific example of the present amplifier but is only 120 dB in the specific example of the prior art device.

The $f_{OF}$ value in the present amplifier is approximately one half the $f_{OF}$ value in the prior art device. However, due to the increased gain in the invention, this is not a problem. Examination of the numerical values shown in FIGS. 8 and 6 indicates that the low-frequency gain of the present amplifier does not drop down to the maximum low-frequency gain of the prior art device until the frequency reaches a value $f_E$ that is approximately twice the $f_{OF}$ value of the prior art device. The present amplifier therefore has better gain/frequency characteristics than the closest prior art device at all relevant points.

To stabilize amplifier portion $A_M$ and $A_O$ in the invention, capacitor C1 has a value much greater than $G_{MM}/4 \pi f_U$, where $G_{MM}$ is the transconductance of stage $A_M$ along its output. Also, to stabilize the entire amplifier, the preferred value of capacitor C1 is $G_{MI2}/2 \pi f_U$, where $G_{MI2}$ is the transconductance of stage $A_I$ along its further ($S_{M2}$) output. Similarly, the preferred value of capacitor C2 is $G_{MI1}/2 \pi f_U$, where $G_{MI1}$ is the transconductance of stage $A_I$ along its main ($S_{M1}$) output.

The specific examples of FIGS. 8 and 6 apply to the condition in which $f_{OS} < f_{MS} < f_{IS}$. Nonetheless, the frequency response is similar if a different inequality exists among $f_{IS}$, $f_{MS}$, and $f_{OS}$. The only difference is in which poles move to the positions represented by $f_{IF}$, $f_{MF}$, and $f_{OF}$.

Figure 9:
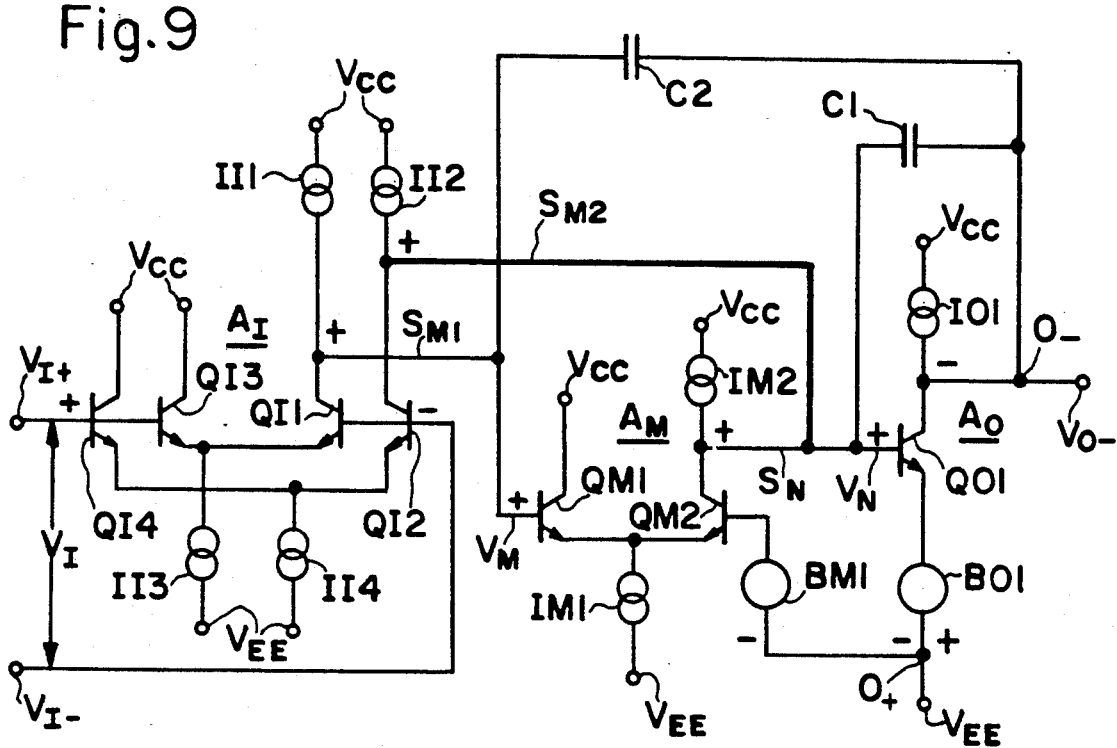
FIGS. 9, 11, and 12 are circuit diagrams for three different bipolar embodiments of the amplifier of FIG. 7.

Turning to FIG. 9, it depicts a typical bipolar embodiment of the present three-stage amplifier. Stages $A_I$, $A_M$, and $A_O$ in FIG. 9 are connected between a source of a high supply voltage $V_{CC}$ and a source of a low supply voltage $V_{EE}$.

Input stage $A_I$ consists of NPN input transistors QI1, QI2, QI3, and QI4 and (substantially constant) current sources II1, II2, II3, and II4 arranged as shown. Voltage $V_{I+}$ is supplied to the QI3 and QI4 bases, while voltage $V_{I-}$ is supplied to the QI1 and QI2 bases. Transistors QI1 and QI3 operate as a conventional differential pair in parallel with transistors QI2 and QI4 which also operate as a conventional differential pair. The main ($S_{M1}$) and further ($S_{M2}$) noninverting outputs of stage $A_I$ are respectively taken at the QI1 and QI2 collectors. Signals $S_{M1}$ and $S_{M2}$ are noninverted.

Intermediate stage $A_M$ is formed with NPN intermediate transistors QM1 and QM2, current sources $I_{M1}$ and $I_{M2}$, and a voltage source BM1 interconnected as shown. Signal $V_M$ is supplied to the QM1 base, while voltage source BM1 provides a reference voltage to the QM2 base. Transistors QM1 and QM2 operate as a conventional differential pair. The $A_M$ noninverting output is taken at the QM2 collector.

Output stage $A_O$ consists of an NPN output transistor QO1, a current source IO1, and an optional voltage source BO1 arranged as shown. Signal $V_N$ is supplied to the base of transistor QO1 whose collector is connected to node $O_-$ at the $A_O$ inverting output. Transistor QO1 functions as an inverter. Node $O_+$ is tied to the $V_{EE}$ supply. Consequently, the device in FIG. 9 is an embodiment of amplifier version (1) discussed above.

Figure 10A:
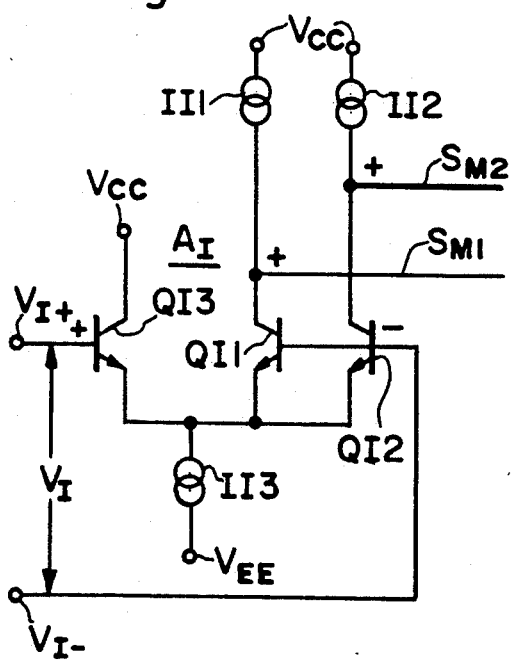
FIGS. 10a and 10b are circuit diagrams for amplifier stages that can alternatively be used in the embodiment of FIG. 9.

FIG. 10a illustrates an example of how input stage $A_I$ in FIG. 9 could be modified. Elements QI4 and II4 have been deleted in FIG. 10a. The QI1–QI3 emitters are now all connected to current source II3 so that transistors QI1–QI3 operate together in a differential manner.

Elements QI3 and II3 could also be deleted in FIG. 10a. The QI1 and QI2 emitters would then be connected directly to the $V_{EE}$ supply. Only voltage $V_{I-}$ would be supplied as an input signal to stage $A_I$. Signals $S_{M1}$ and $S_{M2}$ then become inverted signals.

Figure 10B:
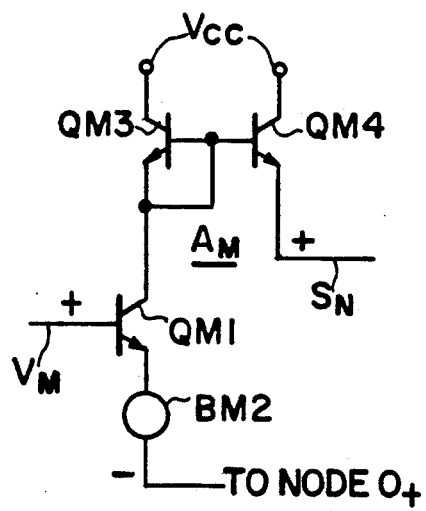

FIG. 10b illustrates an example of how intermediate stage $A_M$ in FIG. 9 could be modified. Elements QM2, IM1, IM2, and BM1 have been deleted in FIG. 10b and replaced with PNP transistors QM3 and QM4 and an optional voltage source BM2 arranged as shown. Transistor QM1 now operates as an inverter. Transistors QM3 and QM4 function as a current mirror that performs a reinversion. The $A_M$ noninverting output is now taken at the QM4 emitter.

Figure 11:
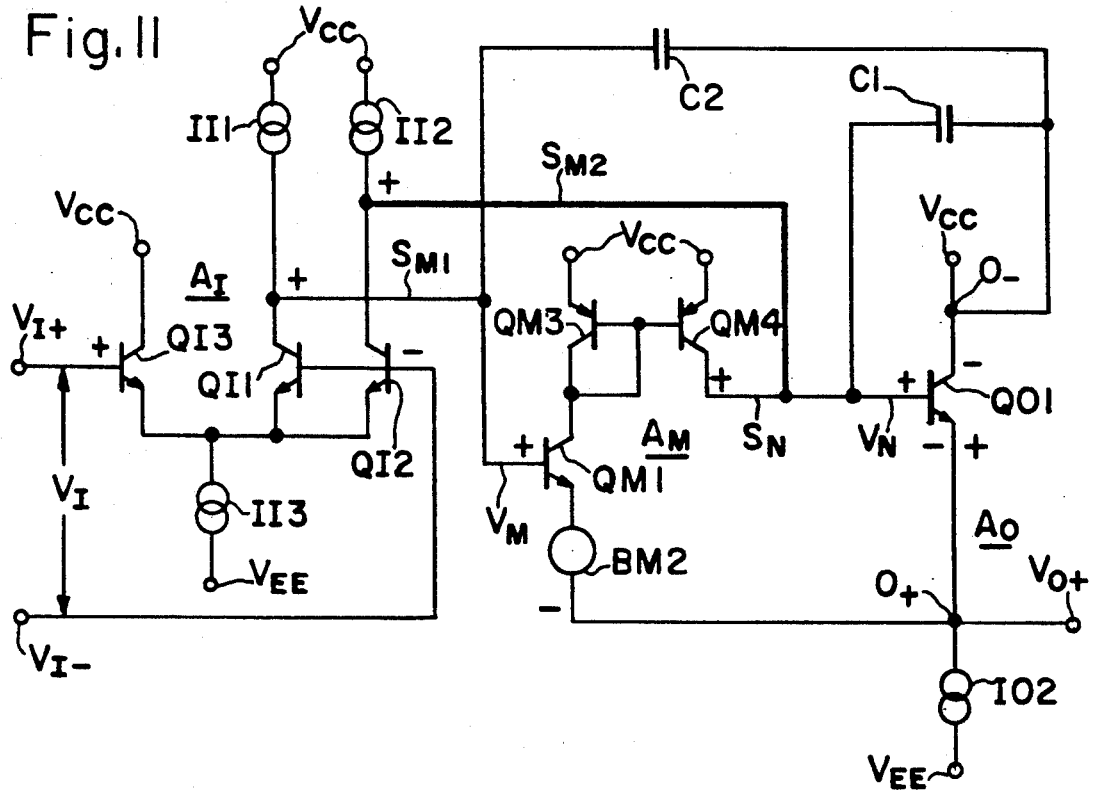

FIG. 11 shows another bipolar implementation of the amplifier of FIG. 7. Stages $A_I$ and $A_M$ in FIG. 11 are respectively the same as in FIGS. 10a and 10b. Again, stage $A_I$ could be further simplified in the manner described above for FIG. 10a.

Stage $A_O$ in FIG. 11 is formed with transistor QO1 and a current source IO2 interconnected as shown. Signal $V_N$ is again supplied to the base of transistor QO1. However, its emitter is now connected to node $O_+$ at the $A_O$ noninverting output. Transistor QO1 functions as a voltage follower here. Node $O_-$ is tied to the $V_{CC}$ supply. As a result, the implementation of FIG. 11 is an example of amplifier version (2).

A current source could be inserted between node $O_-$ and the $V_{CC}$ supply in stage $A_O$ of FIG. II. Stage $A_O$ would then provide voltage $V_{O-}$ from the inverting output at node $O_-$. As so modified, the implementation of FIG. 11 would then be an example of amplifier version (3).

Figure 12:
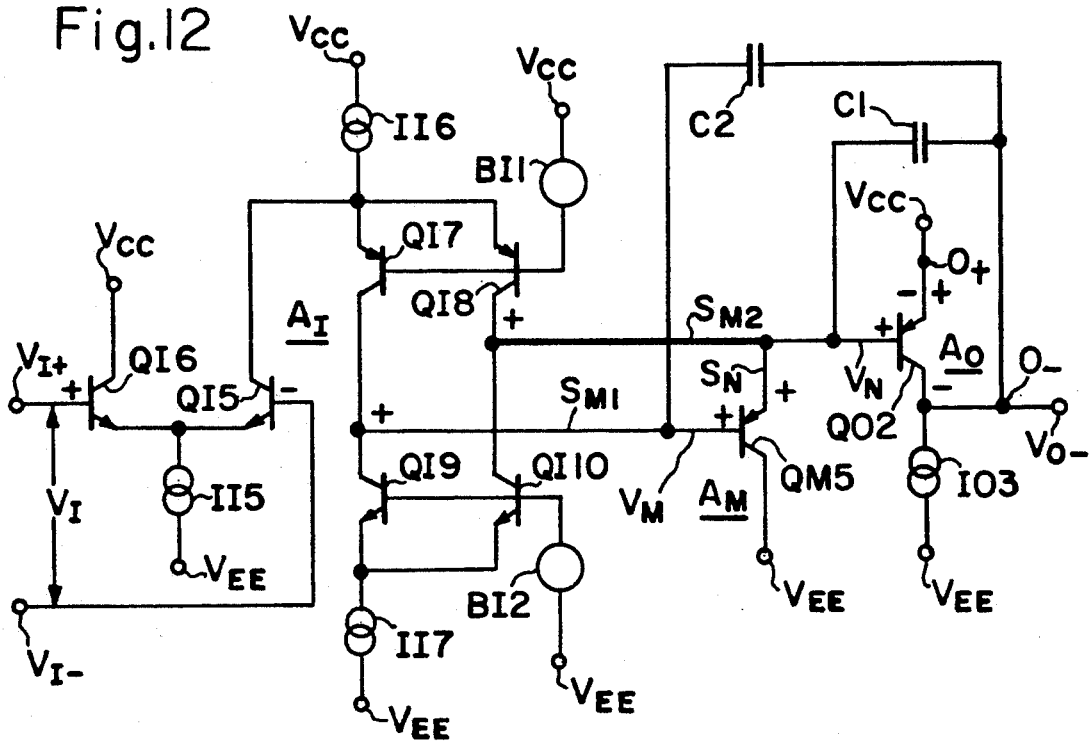

FIG. 12 illustrates a further bipolar embodiment of the present amplifier. Stage $A_I$ now consists of NPN transistors QI5 and QI6, PNP transistors QI7 and QI8, NPN transistors QI9 and QI10, currents sources II5, II6, and II7, and voltage sources BI1 and BI2 arranged as shown. Voltages $V_{I-}$ and $V_{I+}$ are respectively supplied to the bases of transistors QI5 and QI6 which operate as a differential pair. Transistors QI7–QI10 provide a voltage level shift in addition to decoupling the two $A_I$ outputs. The $A_I$ main output is taken at the junction of the QI7 and QI9 collectors. The $A_I$ further output is taken at the junction of the QI8 and QI10 collectors.

Stage $A_M$ in FIG. 12 is formed simply with a pNp transistor QM5 whose base receives signal $V_M$. The $A_M$ noninverting output is taken at the QM5 emitter Transistor QM5 functions as a voltage follower.

Stage $A_O$ in FIG. 12 consists of a PNP transistor QO2 and a current source IO3 arranged as shown. Signal $V_N$ is supplied to the base of transistor QO2 whose collector is connected to node $O_-$ at the $A_O$ inverting output. Transistor QO2 functions as an inverter. Node $O_+$ is tied to the $V_{CC}$ supply. The embodiment of FIG. 12 is thus another example of amplifier version (1).

Each bipolar transistor in stage $A_I$ of FIG. 9, 10a, 11, or 12 could be replaced With a field-effect transistor ("FET") of the insulated-gate or junction type. Like replacements could be made for many of the other bipolar transistors in stages $A_M$ and $A_O$ of FIG. 9, 10b, 11, or 12. More generally, each such transistor could be represented as having a first flow electrode, a second flow electrode, and a control electrode for controlling current flow between the flow electrodes. In the case of a bipolar transistor, its emitter, collector, and base respectively are the first, second, and control electrodes. These elements are the source, drain, and gate for an FET.

Figure 13:
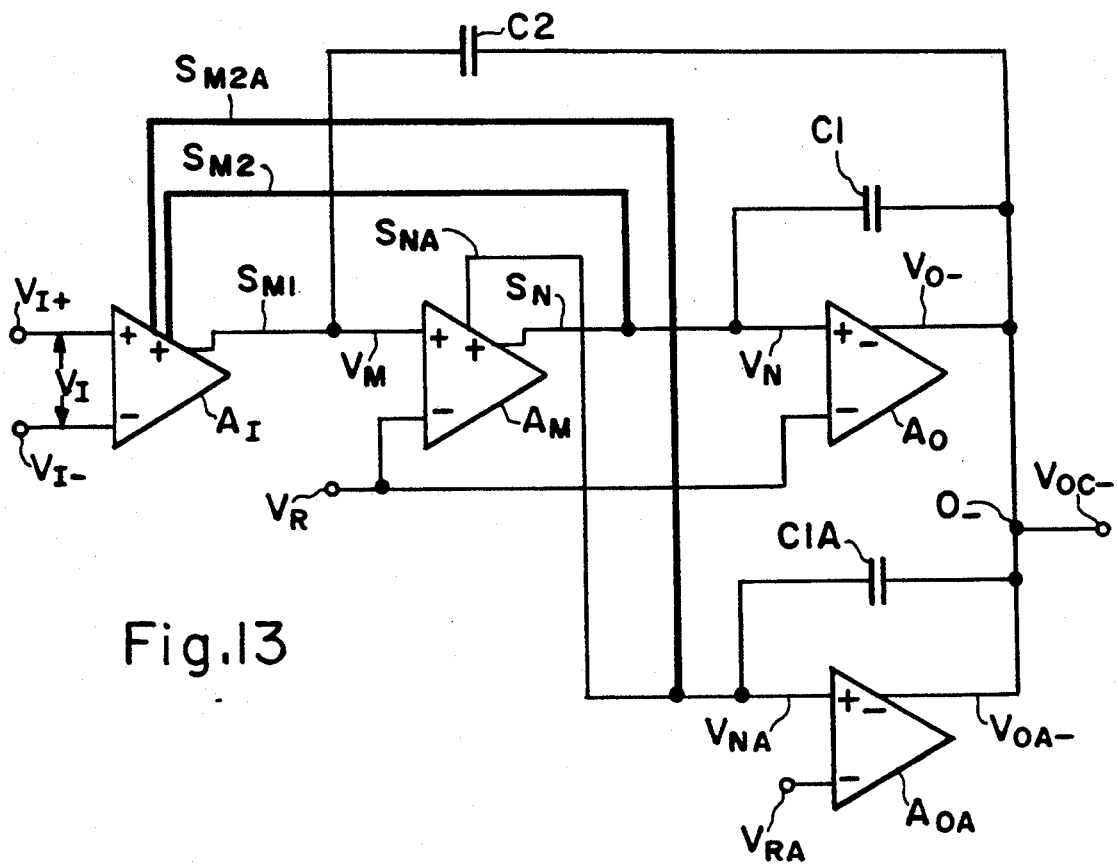
FIGS. 13 and 14 are block diagrams for extensions of the amplifier of FIG. 7.

Moving to FIG. 13, it shows an extension of the amplifier of FIG. 7. This extension contain components $A_I$, $A_M$, $A_O$, C1, and C2 interconnected as described above, except that the $A_M$ and $A_O$ inverting inputs are now explicitly connected to a source of a reference voltage $V_R$. Only inverting voltage $V_{O-}$ is supplied as an $A_O$ output signal.

The extension includes an additional output stage $A_{OA}$ that operates in parallel with stage $A_O$ in a complementary manner. For this purpose, stage $A_M$ amplifies signal $V_M$ relative to voltage $V_R$ to produce an additional noninverted output signal $S_{NA}$ at an additional substantially decoupled noninverting output connected to the $A_{OA}$ noninverting input. Also, stage $A_I$ amplifies the amplifier input signal to produce an additional noninverted output signal $S_{M2A}$ at an additional substantially decoupled noninverting output. The additional ($S_{M2A}$) noninverting output of stage $A_I$ is similarily connected to the $A_{OA}$ noninverting input to set up a separate feed-forward path through the amplifier.

Stage $A_{OA}$ amplifies signal $V_{NA}$ at its noninverting input relative to another reference voltage $V_{RA}$ at its inverting input to produce an inverted output voltage $V_{OA-}$ at an inverting output connected to node $O_-$. An additional capacitor C1A is connected between the $A_{OA}$ noninverting input and node $O_-$. Signals $V_{O-}$ and $V_{OA-}$ are combined at node $O_-$ to produce an inverted voltage $V_{OC-}$ as the final output signal of the extension.

The value of capacitor C1A is chosen so as to make the gain of amplifier portion $A_M$ and $A_{OA}$ fall well within the 9dB/oct. roll-off stability rule. More specifically, the C1A value is much greater than $G_{MMA}/4 \pi f_U$, where $G_{MMA}$ is the transconductance of stage $A_M$ along its additional ($S_{NA}$) output. To stabilize amplifier portion $A_I$, $A_M$, and $A_{OA}$ and thus the entire device, the preferred C1A value is $G_{MI2A}/2 \pi f_U$, where $G_{MI2A}$ is the transconductance of stage $A_I$ along its additional ($S_{M2A}$) output. Capacitors C1 and C2 in the extension of FIG. 13 preferably have the values given above for the amplifier of FIG. 7.

Figure 14:
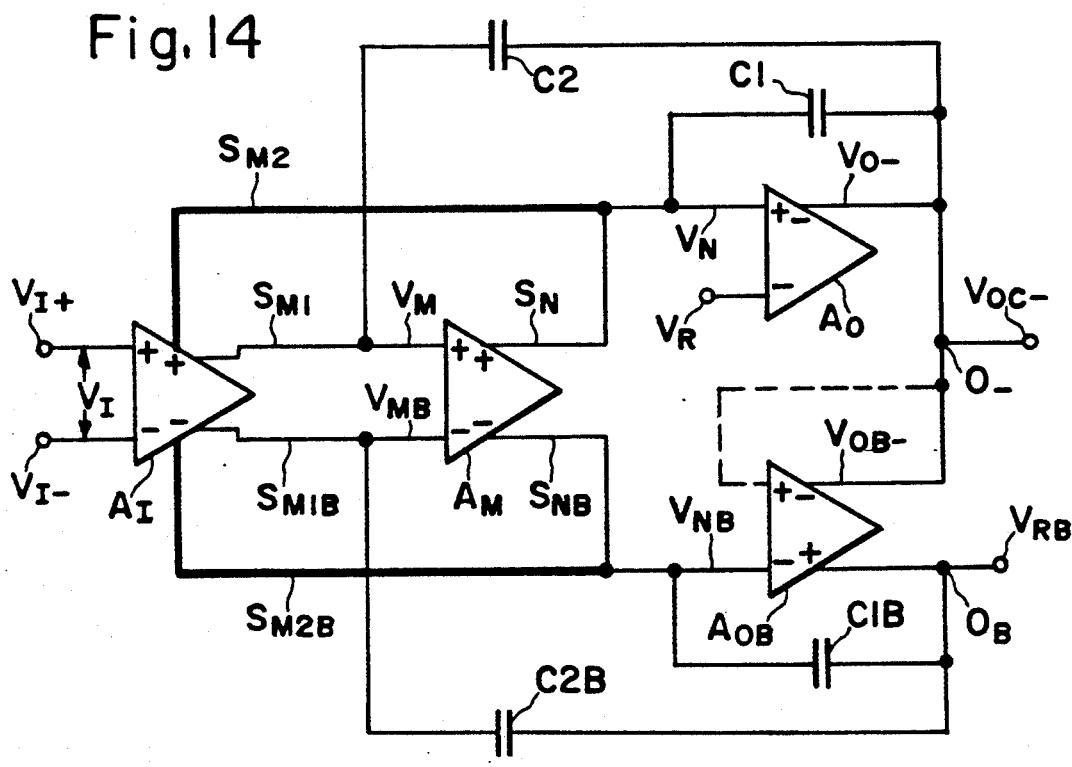

FIG. 14 shows another extension of the amplifier of FIG. 7. The extension in FIG. 14 similarly contains components $A_I$, $A_M$, $A_O$, C1, and C2 interconnected as described above, except that the $A_O$ inverting input is connected to the $V_R$ source. Again, stage $A_O$ only supplies inverting voltage $V_{O-}$ as an output signal. Also, the $A_M$ inverting input is connected in the manner discussed below.

The extension of FIG. 14 includes an additional output stage $A_{OB}$ that operates in parallel with stage $A_O$ in a push-pull manner. To accomplish this function, stage $A_I$ amplifies amplifier input signal $V_I$ to produce main and further inverted output signals $S_{M1B}$ and $S_{M2B}$ at respective main and further substantially decoupled inverting outputs. The main ($S_{M1B}$) inverting output of stage $A_I$ is connected to the $A_M$ inverting input. Stage $A_M$ amplifies signal $V_M$ relative to signal $V_{MB}$ at its inverting input to produce an inverted output signal $S_{NB}$ at an inverting output connected to the $A_{OB}$ inverting input. The further ($S_{M2B}$) inverting output of stage $A_I$ is also connected to $A_{OB}$ inverting input to set up a separate feed-forward path.

Stage $A_{OB}$ amplifies the signal at its noninverting input relative to signal $V_{NB}$ at its inverting input to produce an inverted output voltage $V_{OB-}$ at an inverting output connected to node $O_-$. Signal $V_{OB-}$ is noninverted relative to signal $V_{NB}$. The $A_{OB}$ noninverting input is normally also connected to node $O_-$. Signals $V_{O-}$ and $V_{OB-}$ are combined at node $O_-$ to produce inverted voltage $V_{OC-}$ as the final output signal of the amplifier.

Stage $A_{OB}$ has a noninverting output connected by way of an additional node $O_B$ to a source of an additional reference voltage $V_{RB}$. An additional capacitor C1B is connected between the $A_{OB}$ inverting input and node $O_B$. Capacitor C1B is selected to have such a value that the gain of amplifier portion $A_M$ and $A_{OB}$ falls well within the stability criterion. An additional capacitor C2B is connected between the $A_M$ inverting input and node $O_B$. The values of capacitors C1B and C2B are chosen to make the gain of the combination $A_I$, $A_M$, and $A_{OB}$ meet the stability rule. In particular, capacitors C1B and C2B preferably have values respectively analogous to the preferred C1 and C2 values given below.

Figure 15A:
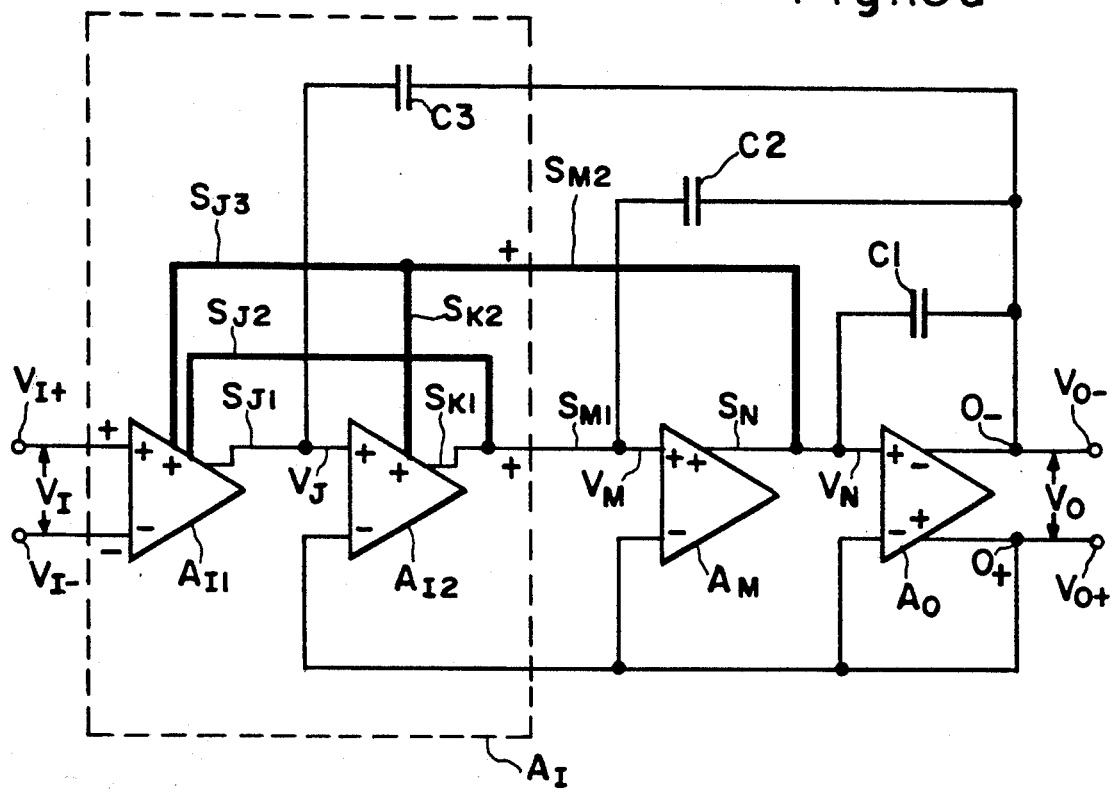
FIGS. 15a and 15b are block diagrams for implementations of the amplifier of FIG. 7 in which the input stage consists of two substages so as to effectively form a four-stage amplifier.

The principles of the present invention can be extended to amplifiers having four or more stages in cascade. Equivalently, stage $A_I$ can consist of two or more capacitively nested substages that have multiple feed-forward paths in accordance with the invention. Turning to FIG. 15a, it depicts an embodiment of how the invention can be extended in this way.

Stage $A_I$ in FIG. 15a contains substages $A_{I1}$ and $A_{I2}$, each of which has a noninverting input, an inverting input, and a noninverting output. The noninverting and inverting inputs of substage $A_{I1}$ are respectively connected to the $A_I$ noninverting and inverting inputs. Substage $A_{I1}$ amplifies the amplifier input signal to produce (a) a main noninverted output signal $S_{J1}$ at a main noninverting output and (b) first and second further noninverted output signals $S_{J2}$ and $S_{J3}$ at respective first and second further noninverting outputs. The three $A_{I1}$ outputs are substantially decoupled from one another.

The main ($S_{J1}$) noninverting output of substage $A_{I1}$ is connected to the $A_{I2}$ noninverting input. Substage $A_{I2}$ amplifies signal $V_J$ at its noninverting input relative to the signal at its inverting input to produce main and further noninverted output signals $S_{K1}$ and $S_{K2}$ at respective main and further substantially decoupled noninverting outputs. The first further ($S_{J2}$) noninverting output of substage $A_{I1}$ and the main ($S_{K1}$) noninverting output of substage $A_{I2}$ are both connected to the main ($S_{M1}$) noninverting output of stage $A_I$. The second further ($S_{J3}$) noninverting output of substage $A_{I1}$ and the further ($S_{K2}$) noninverting output of substage $A_{I2}$ are both connected to the further ($S_{M2}$) noninverting output of stage $A_I$. The further ($S_{J2}$, $S_{J3}$, and $S_{K2}$) output connections all provide separate feed-forward paths.

When the invention is extended in the preceding way, the value of capacitor of C2 is selected to make the gain of amplifier portion $A_{I2}$, $A_M$, and $A_O$ fall well within the stability rule. A capacitor C3 is connected between the $A_{I2}$ noninverting input and node $O_-$. Capacitors C1, C2, and C3 are chosen to have such values that the gain of the entire amplifier meets the stability criterion. Unity-gain frequency $f_U$ for this "four-stage" device is usually the same as $f_U$ for the "three-stage" amplifier of the invention. Consequently, usage of capacitor C3 does not result in any loss in frequency range.

In FIG. 15a, the $A_{I2}$, $A_M$, and $A_O$ inverting inputs are all connected to node $O_+$. The device is thereby an example of amplifier version (3).

Figure 15B:
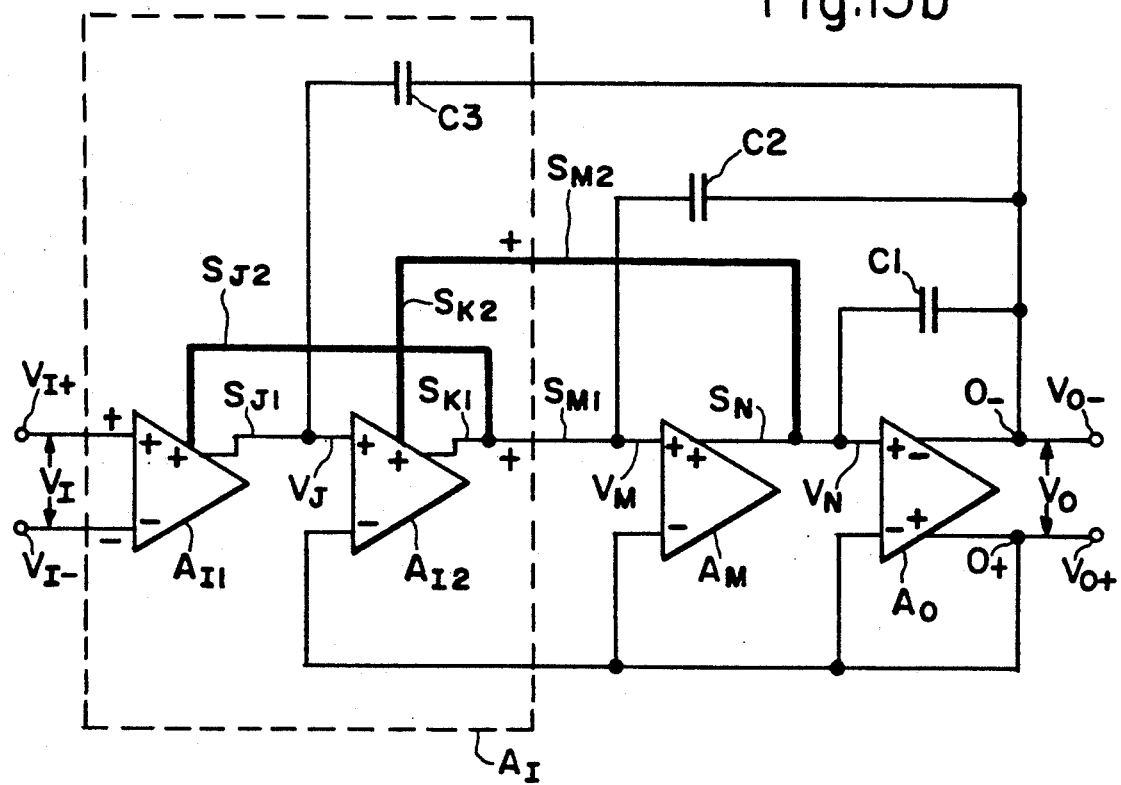

Any single one of the three extra feed-forward paths in stage $A_I$ could be deleted. FIG. 15b illustrates an example of FIG. 15a in which the $S_{J3}$ feed-forward path is absent. Similarly, either the $S_{J2}$ or $S_{K2}$ feed-forward path could be deleted from stage $A_I$.

While the invention has been described with reference to particular embodiments, this description is solely for the purpose of illustration and is not to be construed as limiting the scope of the invention claimed below. For example, resistors could be placed in series with the compensating capacitors.

Inverters could be inserted into parts of the signal paths in such a manner that the overall gain/frequency behavior is not significantly affected. As an example, low-gain inverters could be placed in all of the $S_{M1}$, $V_M$, and C2 signal paths without significantly affecting the amplifier performance. Various modifications and applications may thus be made by those skilled in the art without departing from the true scope and spirit of the invention as defined in the appended claims.

We claims:

1. An amplifier comprising:
   input means that amplifies an input signal received at least partly at an input to produce a main output signal at a main output;
   intermediate means that amplifies an input signal received at least partly at an input coupled to the main output of the input means to produce a noninverted output signal at an output;
   output means that amplifies an input signal received at least partly at an input coupled to the output of the intermediate means to produce an output signal at an output;
   a first capacitor coupled between the input of the output means and a node coupled to (a) the output of the output means if its output signal is inverted or (b) a source of a reference voltage if the output signal of the output means is noninverted; and
   a second capacitor coupled between the input of the intermediate means and the node, the input means also amplifying its input signal to produce a further output signal at a further output coupled to the input of the output means, the two output signals of the input means being of the same polarity, the two outputs of the input means being substantially electronically decoupled from each other.

2. An amplifier as in claim 1 wherein the forward gain of the amplifier does not roll off more than 9 dB/octave out to its unity-gain frequency.

3. An amplifier as in claim 1 wherein the output signal of the output means is inverted, and the output means also amplifies its input signal to produce a noninverted output signal at a further output.

4. An amplifier as in claim 3 wherein the input signal to the output means is supplied between its input and another input coupled to the further output of the output means.

5. An amplifier as in claim 4 wherein the input signal to the intermediate means is supplied between its input and another input coupled to the further output of the output means.

6. An amplifier as in claim 1 wherein the output signal of the output means is noninverted, and the input signal to the output means is supplied between its input and another input coupled to the output of the output means.

7. An amplifier as in claim 6 wherein the input signal to the intermediate means is supplied between its input and another input coupled to the output of the output means.

8. An amplifier as in claim 1 wherein the input signal to the input means is supplied between its input and another input.

9. An amplifier as in claim 1 wherein the output signals of the input means are noninverted.

10. An amplifier as in claim 1 wherein the output signals of the input means are inverted.

11. An amplifier as in claim 1 wherein the input means comprises:

first and second transistors, each having a first flow electrode, a second flow electrode, and a control electrode for controlling current flow between the flow electrodes, the control electrodes being responsive to the input signal to the input means, the second electrodes of the first and second transistors being respectively coupled to the main and further outputs of the input means; and first and second current supplies respectively coupled to the main and further outputs of the input means.

12. An amplifier as in claim 11 wherein the input means further includes:

a third transistor having a first flow electrode, a second flow electrode, and a control electrode for controlling current flow between that transistor's flow electrodes, the control electrode of the third transistor being coupled to the input of the input means, the control electrodes of the first and second transistors being coupled to another input of the input means such that its input signal is differentially supplied between its inputs; and a third current supply coupled to the first electrodes of the three transistors.

13. An amplifier as in claim 11 wherein the input means further includes:

third and fourth transistors, each having a first flow electrode, a second flow electrode, and a control electrode for controlling current flow between that transistor's flow electrodes, the control electrodes of the third and fourth transistors being coupled to the input of the input means, the control electrodes of the first and second transistors being coupled to another input of the input mean such that its input signal is differentially supplied between its inputs;

a third current supply coupled to the first electrodes of the first and third transistors; and a fourth current supply coupled to the first electrodes of the second and fourth transistors.

14. An amplifier as in claim 11 wherein the transistors are like-polarity bipolar transistors, each having an emitter, a collector, and a base which respectively are the first, second, and control electrodes of that transistor.

15. An amplifier as in claim 1 wherein the output signal of the output means is inverted, the amplifier further including:

additional output means that amplifies an input signal received at least partly at an input to produce an inverted output signal at an output coupled to the node, where (a) the input means also amplifies its input signal to produce an additional output signal at an additional output coupled to the input of the additional output means, the three output signals of the input means being of the same polarity, and (b) the intermediate means also amplifies its input signal to produce an additional output signal at an additional output coupled to the input of the additional output means, the two output signals of the intermediate means being of the same polarity; and an additional first capacitor coupled between the node and the input of the additional output means.

16. An amplifier as in claim 1 wherein the output signals of the input means are noninverted, and the output signal of the output means is inverted, the amplifier further including:

additional output means that amplifies an input signal received at least partly at an input to produce a noninverted output signal at an output coupled to the node, where (a) the input means also amplifies its input signal to produce a pair of inverted output signals at a pair of outputs respectively coupled to an additional input of the intermediate means and to the input of the additional output means and (b) the intermediate means also amplifies its input signal to produce an inverted output signal at an output coupled to the input of the additional output means;

an additional first capacitor coupled between the input of the additional output means and an additional node coupled to a source of a reference voltage; and an additional second capacitor coupled between the additional input of the intermediate means and the additional node.

17. An amplifier as in claim 1 wherein the input means comprises:

first submeans that amplifies an input signal received at least partly at an input coupled to the input of the input means to produce a main output signal at a main output;

second submeans that amplifies an input signal received at least partly at an input coupled to the main output of the first submeans to produce a main noninverted output signal at a main output coupled to the main output of the input means; and a third capacitor coupled between the input of the second submeans and the node, the input means being configured to accomplish at least two of the following three functions: (1) the first submeans also amplifies its input signal to produce a further output signal at a further output coupled to the main output of the input means, (2) the first submeans also amplifies its input signal to produce a further output signal at a further output coupled to the further output of the input means, and (3) the second submeans also amplifies its input signal to produce a further noninverted output signal at a further output coupled to the further output of the input means, each further output signal of the first submeans being of the same polarity as its main output signal, each output of each submeans being substantially electronically decoupled from each other output of that submeans.

18. An amplifier as in claim 17 wherein the output signals of the first submeans are noninverted.

19. An amplifier comprising:

input means that amplifies an input signal received at least partly at an input to produce a main output signal at a main output;

intermediate means that amplifies an input signal received at least partly at an input coupled to the main output of the input means to produce a noninverted output signal at an output;

output means that amplifies an input signal received at least partly at an input coupled to the output of the intermediate means to produce an output signal at an output;

a first capacitor coupled between the input of the output means and a node coupled to (a) the output of the output means if its output signal is inverted or (b) a source of a reference voltage if the output signal of the output means is noninverted; and a second capacitor coupled between the input of the intermediate means and the node, the input means also amplifying its input signal to produce a further output signal at a further output coupled directly to the input of the output means, the two output signals of the input means being of the same polarity.

20. An amplifier as in claim 19 wherein the two outputs of the input means are substantially electronically decoupled from each other.

* * * * *